(12) United States Patent
Ishikawa et al.

(10) Patent No.: US 6,169,301 B1
(45) Date of Patent: *Jan. 2, 2001

(54) PLANAR DIELECTRIC INTEGRATED CIRCUIT

(75) Inventors: Yohei Ishikawa, Kyoto; Koichi Sakamoto, Nagaokakyo; Sadao Yamashita, Kyoto; Takehisa Kajikawa, Osaka, all of (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/030,971

(22) Filed: Feb. 26, 1998

(30) Foreign Application Priority Data

Feb. 27, 1997 (JP) .................................................... 9-044163

(51) Int. Cl.$^7$ .......................... H01L 29/80; H01L 31/112
(52) U.S. Cl. ........................................... 257/275; 257/276
(58) Field of Search ..................................... 257/275, 276

(56) References Cited

U.S. PATENT DOCUMENTS

| 4,463,330 | 7/1984 | Yoneyama | 333/239 |
|---|---|---|---|
| 5,532,506 | * 7/1996 | Tserns . | |

FOREIGN PATENT DOCUMENTS

| 60153602 | 8/1985 | (EP) . |
|---|---|---|
| 0735604 | 10/1996 | (EP) . |
| 6-29376 | * 2/1994 | (JP) . |

OTHER PUBLICATIONS

Artuzi W.A. et al: "A HEMT Amplifier For Nonradiative Dielectric Waveguide Integrated Circuits", IEICE Transactions, vol. E74, No. 5, May 1991, pp. 1185–1190.

Pehl, E: "Microwave Lines And Their Applications", Materials Science and Engineering B, vol. 1, No. 1, Jun. 10, 1986, pp. 1–16.

Liang Han et al: "An Integrated Transition of Microstrip to Nonradiative Dielectric Waveguide for Microwave and Millimeter–Wave Circuits:", IEEE Transactions on Microwave Theory and Techniques, vol. 44, No. 7, PART 01, Jul. 1, 1996, pp. 1091–1096.

* cited by examiner

Primary Examiner—Stephen D. Meier
(74) Attorney, Agent, or Firm—Ostrolenk, Faber, Gerb & Soffen, LLP

(57) ABSTRACT

A planar dielectric integrated circuit is provided such that energy conversion loss between a planar dielectric line and electronic components is small and that impedance matching between them can be easily obtained. By providing slots which oppose both main surfaces of a circuit substrate, two planar dielectric lines are constructed. A slot line, and a first line-conversion conductor pattern which is connected to the electromagnetic field of the slot line and a first planar dielectric line in order to perform line conversion, are provided at the end portion of the first planar dielectric line, including a slot. A coplanar line and a second line-conversion conductor which is made to project in a direction at right angles to a second planar dielectric line is provided at the end portion of the second planar dielectric line, including a slot. A semiconductor device is placed in such a manner as to be extended over the coplanar line and the slot line.

4 Claims, 8 Drawing Sheets

PLANAR DIELECTRIC INTEGRATED CIRCUIT

BACKGROUND OF THE INVENTION

1. Field of the Invention

The present invention relates to a planar dielectric integrated circuit for use in a millimetric-wave band and a microwave band.

2. Description of the Related Art

In a millimetric-wave band and a microwave band, transmission lines have been often used which are constructed by forming a predetermined conductor on a dielectric substrate to form a waveguide, a coaxial line, a microstrip line, a coplanar line, a slot line, and the like. In particular, in a dielectric substrate having a transmission line formed thereon, since connection with electronic components, such as ICs, is easy, many attempts to form an integrated circuit by mounting electronic components onto a dielectric substrate have been made.

However, in the conventional microstrip line, coplanar line, slot line, and the like, since transmission loss is relatively large, these are not suitable for a circuit requiring, particularly, a low transmission loss. Therefore, the applicant of the present invention submitted the invention concerning a planar dielectric line and an integrated circuit, which solve these problems, in Japanese laid-open Patent Application No. Hei-08-265007.

Moreover, since the input/output sections of electronic components, such as semiconductor devices, and the planar dielectric line generally differ in the electromagnetic-field distribution, merely mounting electronic components to the planar dielectric line causes the conversion loss to increase greatly. Further, if electronic components are only mounted to one surface of the dielectric plate, no connection between the electromagnetic field on the back surface thereof and the electronic components is made, this point also leading to an increase in the conversion loss. Mounting electronic components to both surfaces of the dielectric plate eliminates the latter problem; however, this results in a decrease in the characteristic reproducibility (yield) due to the characteristic variations of the electronic components, an increase in loss, and an increase in the material and mounting costs.

SUMMARY OF THE INVENTION

An object of the present invention is to provide a planar dielectric integrated circuit such that energy conversion loss between the planar dielectric line and electronic components is small, and impedance matching between them is obtained easily.

According to the aspect of the present invention, to perform integration by reducing a signal loss in the coupled section of the planar dielectric line and the electronic components and while maintaining a low loss characteristic, which is a feature of the planar dielectric line, a planar dielectric line is constructed such that two conductors are provided at a fixed distance on a first main surface of a dielectric plate to provide a first slot, two conductors are provided at a fixed distance on a second main surface of a dielectric plate to provide a second slot which opposes the first slot, with the area sandwiched between the first slot and the second slot of the dielectric plate being formed as a plane-wave propagation area. A coplanar line is provided in the end portion or at the midpoint of the planar dielectric line, a line-conversion conductor pattern is provided which projects from the center conductor of the coplanar line in a direction at right angles to the planar dielectric line, and electronic components are disposed in such a manner as to be extended over the coplanar line.

With this construction, an LSM-mode signal which propagates through the planar dielectric line is coupled to the line-conversion conductor pattern which projects in a direction at right angles to the planar dielectric line, and is converted into the propagation mode of the coplanar line. And a signal is input to the electronic components disposed in such a manner as to extend over this coplanar line. Conversely, when a signal is output from the electronic components, the signal is propagated in the propagation mode of the coplanar line and, as a result of the coupling between the line-conversion conductor pattern which projects in a direction at right angles to the planar dielectric line and the planar dielectric line, the signal propagates through the planar dielectric line in the LSM mode.

Preferably, two planar dielectric lines are constructed such that a first slot is provided by disposing two electrodes at fixed intervals on a first main surface of the dielectric plate, a second slot, which opposes the first slot, is provided by disposing two electrodes at fixed intervals on a second main surface of the dielectric plate, with the area sandwiched by the first slot and the second slot of the conductor plate being formed as a propagation area of a plane wave. A first line-conversion conductor pattern which is connected to the electromagnetic field of a slot line and the first planar dielectric line is provided at one end portion of the slot line, and a coplanar line is provided in the vicinity of the other end portion of the slot line. A second line-conversion conductor pattern is provided which projects from the center conductor at the end portion of the coplanar line in a direction at right angles to the second planar dielectric line. The electronic components are disposed in such a manner as to extend over the coplanar line and the slot line.

With this construction, the LSM-mode signal which propagates through the first planar dielectric line is coupled to the first line-conversion conductor pattern, is converted into a TE mode, propagates through the slot line, and is input to the electronic components. The LSM-mode signal which propagates through the second planar dielectric line is coupled to the second line-conversion conductor pattern, is converted into the propagation mode of the coplanar line, and is input to the electronic component. In response, the electronic component performs a signal processing, such as synthesizing two signals input from the first and second planar dielectric lines. When, for example, this electronic component is a mixer FET (field-effect transistor) or a mixer diode, by inputting an RF signal and a Lo signal from the first and second planar dielectric lines, respectively, an IF signal can be taken from the bias voltage supply line to the external source.

Preferably, a short stub which is used to obtain impedance matching between the line-conversion conductor pattern and the electronic components is provided at the midpoint of the slot line or the coplanar line. As a result, impedance matching is obtained between the line-conversion conductor pattern and the electronic components, and the loss in the connection section of the slot line and the electronic components is reduced.

Further, preferably, an impedance matching circuit is provided between the line-conversion conductor pattern and the slot line or the coplanar line. As a result, impedance matching is obtained between the line-conversion conductor pattern and the planar dielectric line and the slot line or the coplanar line, thereby suppressing unwanted reflection and reducing the transmission loss caused by line conversion.

The above and further objects, aspects and novel features of the invention will become more apparent from the following detailed description when read in connection with the accompanying drawings.

DESCRIPTION OF THE PREFERRED EMBODIMENTS

The construction of a mixer according to a first embodiment of the present invention will be described with reference to FIGS. 1A and 1B to 7.

Figure 1A:
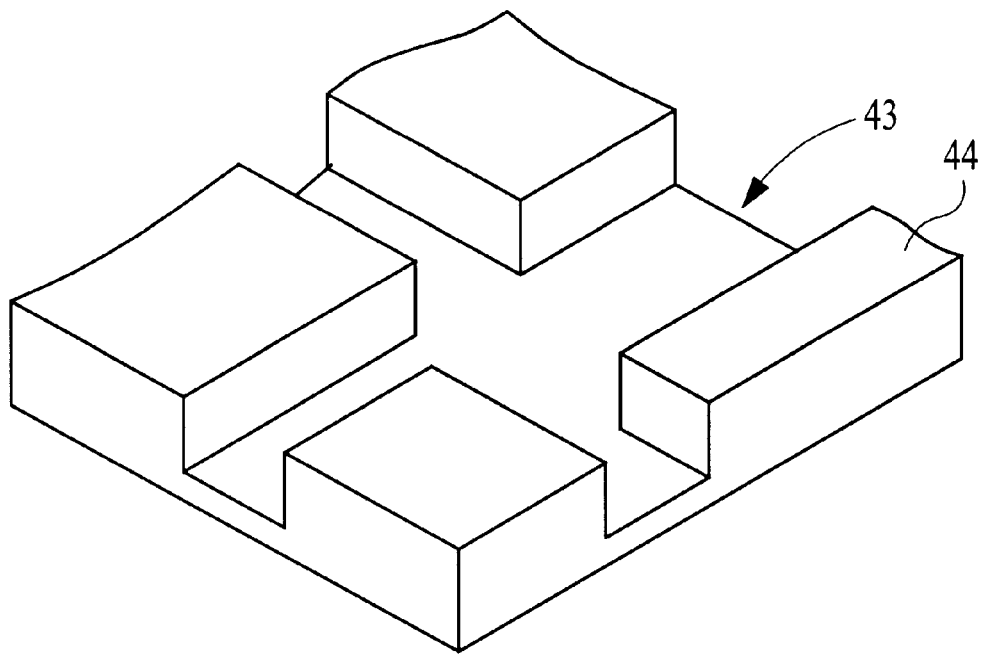
FIGS. 1A and 1B are partial, exploded perspective views showing the construction of a mixer according to a first embodiment of the present invention.
Figure 1B:
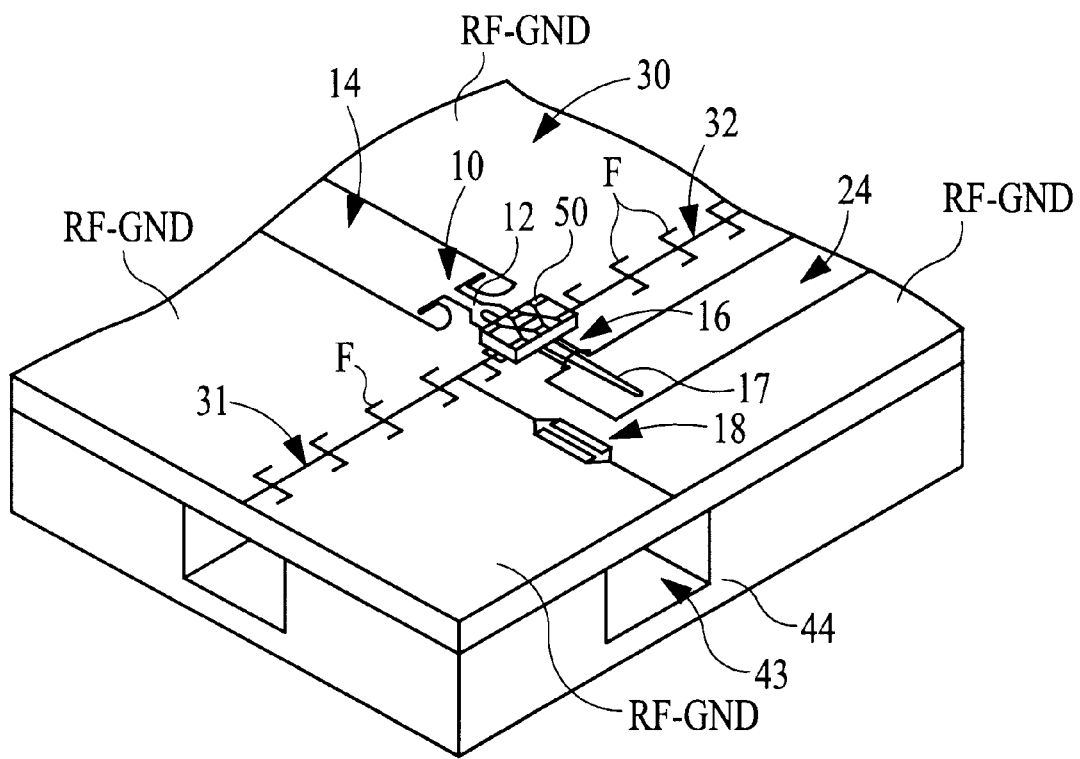

FIGS. 1A and 1B are partial, exploded perspective views showing the construction of the mixer. FIG. 1A is a perspective view of a low-part conductor plate 44, with a groove being formed in the top surface of the low-part conductor plate in the figure, thereby a space section indicated by 43 being provided. FIG. 1B shows a state in which a circuit substrate 30 is placed on the top surface of the low-part conductor plate shown in FIG. 1A. The circuit substrate 30 is such that various conductor patterns are formed on the top and bottom surfaces of the conductor plate, with a slot-line-input-type FET (millimetric-wave GaAs FET) 50 being mounted onto the top surface of the circuit substrate 30. Reference numerals 14 and 24 each denote a slot on the top surface of the circuit substrate 30, formed by exposing the upper surface of the substrate 30, and, as will be described later, form first and second planar dielectric lines together with the opposing slot on the bottom surface with the circuit substrate 30 interposed in between. Reference numeral 12 denotes a slot line formed at the end portion of the first planar dielectric line. Reference numeral 10 denotes a first line-conversion conductor pattern provided at one end portion of the slot line 12, which is connected to the first planar dielectric line and which is used to perform mode conversion between it and the slot line. Reference numeral 16 denotes a coplanar line formed in the vicinity of the other end portion of the slot line 12, with a second line-conversion conductor pattern 17 projecting from the center conductor of the coplanar line in a direction at right angles to the second planar dielectric line. Reference numerals 31 and 32 each denote a coplanar line, which supplies a gate bias voltage and a drain bias voltage to an FET 50. These two coplanar lines 31 and 32 are provided with filters indicated by F. Reference numeral 18 denotes an interdigital capacitor, forming a capacitor between the center conductor of the coplanar line 31 and another conductor. The peripheral portion of each of the above-described patterns comprises, as an RF-GND (grounding conductor), the top surface of the circuit substrate 30. Slots which oppose the slots 14 and 24, respectively, are provided on the bottom surface of the circuit substrate 30, and in other areas of the bottom surface of the circuit substrate 30, an RF-GND is formed.

Figure 2:
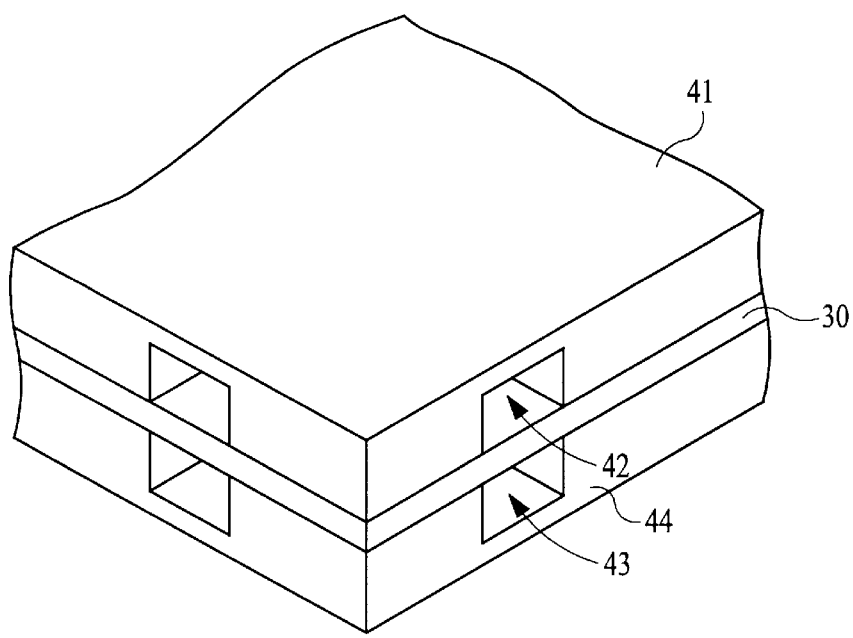
FIG. 2 is a perspective view showing the entire construction of the mixer.

FIG. 2 shows a state in which an upper-part conductor plate 41 is further placed on the top surface with respect to the state shown in FIG. 1B. By forming a groove in a plane symmetry (mirror symmetry) with respect to the groove of the low-part conductor plate 44 in the inner surface of the upper-part conductor plate 41, a space section 42 is provided.

Figure 3:
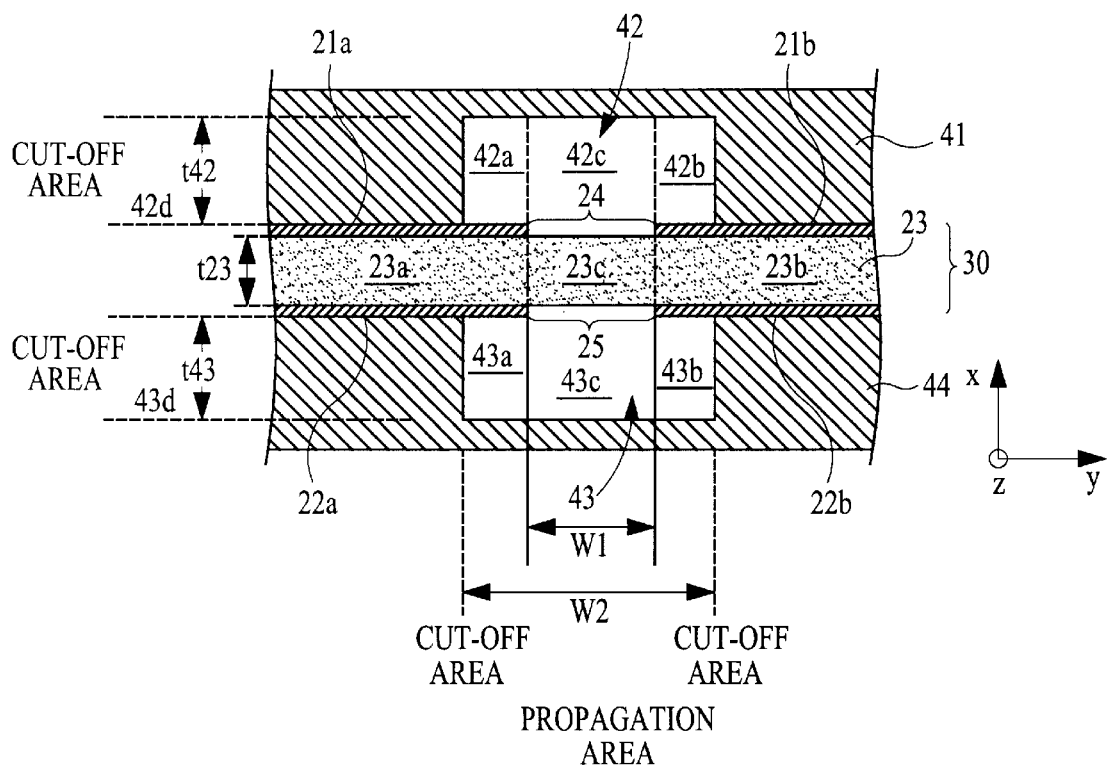
FIG. 3 is a transverse sectional view of a planar dielectric line.

FIG. 3 is a sectional view passing transversely through the slot 24 shown in FIG. 1. In FIG. 3, reference numeral 23 denotes a dielectric plate, with two conductor plates 21a and 21b being formed on the first main surface (the top surface in the figure) thereof, forming the portion indicated by 24 as a first slot. Further, two conductor plates 22a and 22b are formed on the second main surface (the bottom surface in the figure) of the dielectric plate 23, forming the portion indicated by 25 as a second slot. The two conductor plates 41 and 44 are provided with spaces 42 and 43 near slots 24 and 25, and cause both the sections between the conductor plates 21a and 21b and the section between the conductor plates 22a and 22b to conduct.

The portion indicated by 23c, shown in FIG. 3, which is provided in the dielectric plate 23 between the opposing slots 24 and 25, becomes a propagation area in which a high-frequency signal having a desired propagation frequency fb is made to propagate. Further, the portions indicated by 23a and 23b on both sides, which sandwich the propagation area 23c, become cut-off areas.

Figure 4:
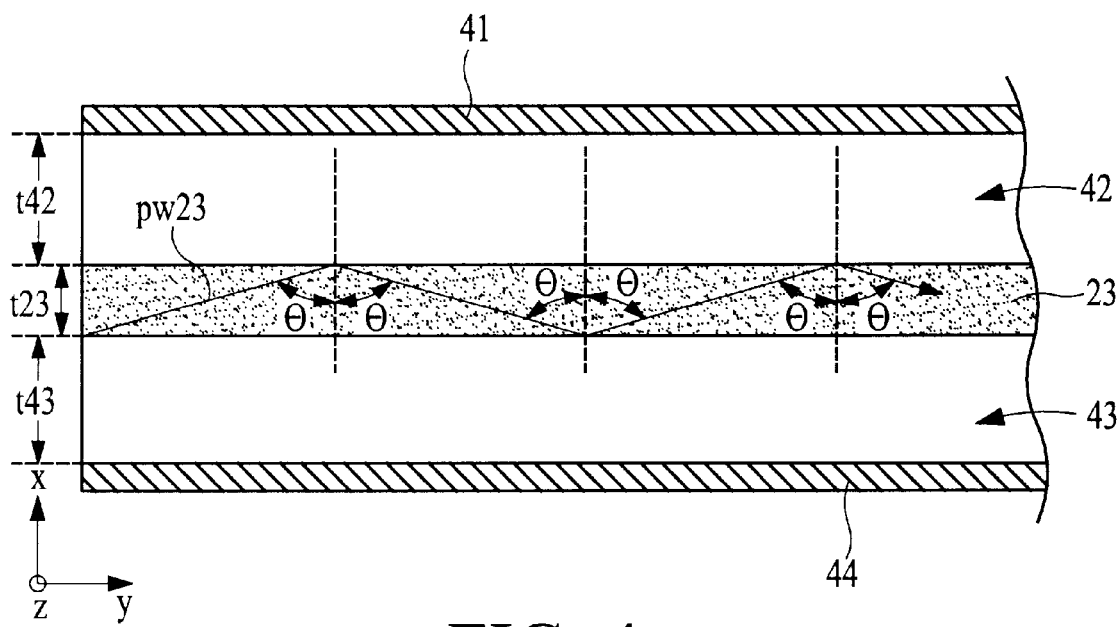
FIG. 4 is a longitudinal sectional view of the planar dielectric line.

FIG. 4 is a longitudinal sectional view in a plane in which the propagation area of the planar dielectric line shown in FIG. 3 passes in the direction of the propagation. As shown in FIG. 4, a plane electromagnetic wave pw23, which is an electromagnetic wave of a plane wave, enters the top surface (the slot 24 portion) of the dielectric plate 23 at a predetermined incidence angle θ and is reflected at a reflection angle θ equal to the incidence angle θ. Further, the plane electromagnetic wave pw23 reflected on the top surface of the dielectric plate 23 enters the bottom surface (the slot 25 portion) of the dielectric plate 23 at an incidence angle θ and is reflected at a reflection angle θ equal to the incidence angle θ. Thereafter, the plane electromagnetic wave pw23 is repeatedly reflected alternately with the the slots 24 and 25 (surface portions of the dielectric plate 23) as the boundary surfaces, and propagates through the propagation area 23c of the dielectric plate 23 in the TE mode. In other words, the specific dielectric constant of the dielectric plate 23 and the thickness t23 of the dielectric plate 23 are determined so that the desired propagation frequency fb becomes equal to or greater than a critical frequency fda (the frequency at which a state is reached in which the incidence angle θ is decreased, the plane electromagnetic wave pw23 passes through the spaces 42 and 43, and the plane electromagnetic wave pw23 which propagates through the propagation area 23c is attenuated).

Opposing electrodes 21a and 22a with the dielectric plate 23, shown in FIG. 3, interposed therebetween form a parallel-plate waveguide having a cut-off frequency sufficiently higher than the desired propagation frequency fb with respect to the TE wave. As a result, a cut-off area 23a with respect to the TE wave having electric-field components parallel to the electrodes 21a and 22a is formed on one side in the width direction of the dielectric plate 23 sandwiched by the electrodes 21a and 22a. In a similar manner, electrodes 21b and 22b with the conductor plate 23 interposed therebetween form a parallel-plate waveguide having a cut-off frequency sufficiently higher than the desired propagation frequency fb with respect to the TE wave, and a cut-off area 23b with respect to the TE wave is formed on one side in the width direction of the dielectric plate 23 sandwiched by the electrodes 21a and 22b.

Further, the top surface of the space 42 in the figure and the electrode 21a form a parallel-plate waveguide, and the thickness t42 thereof is set so that the cut-off frequency with respect to the TE wave of the parallel-plate waveguide becomes sufficiently higher than the desired propagation frequency fb. As a result, a cut-off area with respect to the TE wave is formed in the portion indicated by 42a. In a similar manner, a cut-off area with respect to the TE wave is formed in each of the portions indicated by 42b, 43a, and 43b.

The opposing inner surface (the longitudinal wall in the figure) of the space 42 forms a parallel-plate waveguide, and the width W2 thereof is set so that the cut-off frequency with respect to the TE wave of the parallel-plate waveguide becomes sufficiently higher than the desired propagation frequency fb, thereby forming a cut-off area 42d. For the space 43, similarly, a cut-off area 43d is formed.

As a result of forming the planar dielectric line as described above, it is possible to cause the electromagnetic-field energy of a high-frequency signal having a frequency equal to or higher than the critical frequency fda to be concentrated in the inside of the propagation area 23c and in the vicinity thereof and to cause the plane wave to propagate in the direction of the length (in the direction of the z axis) of the dielectric plate 23.

In the case where a signal in, for example, the 60-GHz band is propagated, if the specific dielectric constant of the dielectric plate 23 is set at 20 to 30, then the plate thickness t is 0.3 to 0.8 μm, an appropriate line width W1 is 0.4 to 1.6 mm, and a characteristic impedance in a range of 30 to 200 Ω is obtained. Further, if a dielectric plate having a specific dielectric constant of 20 or more is used as described above, energy of 90% or more is trapped within the dielectric plate, and a transmission line with a very low loss because of total reflection can be realized.

In the above, the second planar dielectric line has been described. The first planar dielectric line, including the slot 14 shown in FIG. 1, is similarly constructed.

Figure 5:
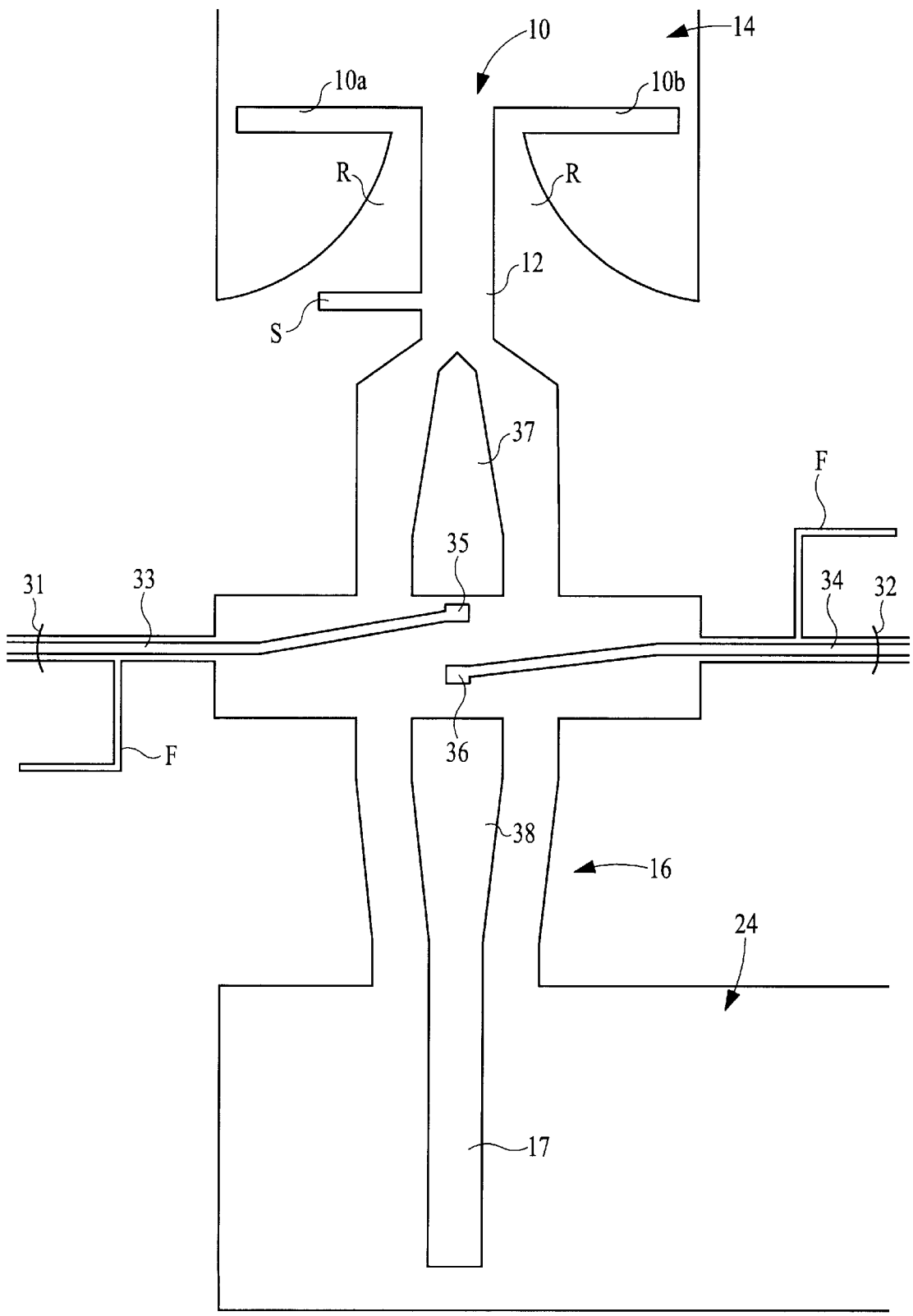
FIG. 5 is a view showing conductor patterns on a circuit substrate.

FIG. 5 is a view showing the conductor patterns of the main portion of the top surface of the circuit substrate 30. In FIG. 5, reference numeral 12 denotes a slot line, with a first line-conversion conductor pattern 10 being formed at one end portion of this slot line 12. This first line-conversion conductor pattern 10 is in the shape of a dipole antenna, as indicated by 10a and 10b, respectively. The root portion of the line-conversion conductor pattern 10 with respect to the end portion of the slot line 12 form an impedance matching section (impedance matching circuit) R which is tapered moderately from the slot line 12 toward the line-conversion conductor pattern 10 in order that the wiring resistance of the line-conversion conductor pattern 10 is reduced to decrease the conversion loss. If the wavelength of the frequency in the used frequency band in each of the electrode patterns 10a and 10b and the impedance matching section R is denoted as λ, they have a length of about λ/4, and the width of the slot line 12 is determined by the characteristic impedance of the line to be designed. A line-conversion conductor pattern having the same structure is explained in the co-pending U.S. Pat. application Ser. No. 031,981 filed Feb. 26, 1998. For example, a characteristic impedance of 30 to 100 Ω can be realized at a width of 0.05 to 0.20 mm. A coplanar line 16 is formed by an RF-GND and a center conductor 38, with the second line-conversion conductor pattern 17 being projected from this center conductor 38 in a direction at right angles to the second planar dielectric line, into the a slot 24. This second line-conversion conductor pattern forms the shape of a monopole antenna. The dimensions of the coplanar line 16 are determined by the characteristic impedance of the line to be designed. For example, when the width of the center conductor is 0.1 to 0.15 mm and the spacing of the RF-GNDs on both sides thereof is 0.2 to 1.0 mm, a characteristic impedance of 30 to 90 Ω can be realized. As a result of the above, this coplanar line 16 forms an impedance matching circuit, as a pattern which is tapered up to a fixed width from the root portion thereof in the direction of the end (the second line-conversion conductor pattern 17). As described above, the characteristic impedance of the planar dielectric line is 30 to 200 Ω, and the input/output impedance of the FET (millimetric-wave GaAs FET) 50 is usually about 30 to 90 Ω; therefore, the four, including the planar dielectric line, the slot line, the FET, and the coplanar line, easily obtain impedance matching. Further, by providing a short stub S having an appropriate length at the midpoint of the slot line 12, it is possible to obtain impedance matching easily between the first line-conversion conductor pattern 10 and the FET. In a similar manner, by providing an open stub at the midpoint of the coplanar line 16, it is possible to obtain impedance matching easily between the second line-conversion conductor pattern 17 and the FET.

In FIG. 5, reference numeral 37 denotes a conductor for branching the slot line, reference numeral 38 denotes a center conductor of the coplanar line 16, reference numeral 35 denotes a gate terminal, and reference numeral 36 denotes a drain terminal, to which is connected each terminal of the FET to be described later. Reference numerals 31 and 32 each denote a coplanar line, with the center conductors 33 and 34 thereof being extended out to the gate terminal 35 and the drain terminal 36, respectively. As also shown in FIG. 1B, filters which function as low-pass filters indicated by F are formed at the midpoint of the coplanar lines 31 and 32 so that the RF signal does not leak to the bias circuit side and does not propagate.

Between the two planar dielectric lines, an RF-GND is provided, and a distance is required such that an RF signal or a Lo signal is cut off between the two planar dielectric lines; a width equal to or greater than 1 mm is sufficient.

Figure 6:
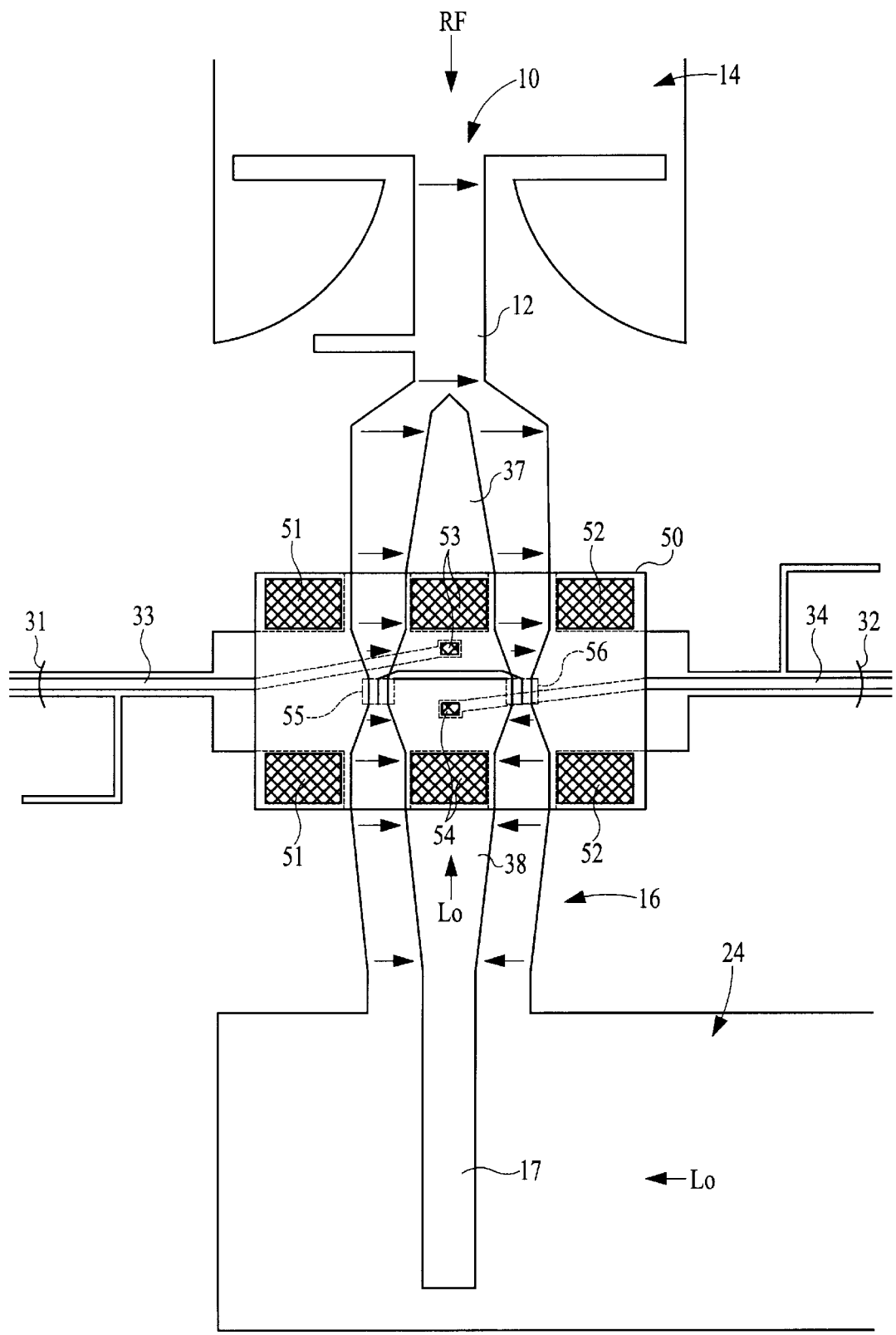
FIG. 6 is a view showing a state in which an FET is mounted with respect to FIG. 5.

FIG. 6 is a view showing a state in which the FET 50 is mounted with respect to the state shown in FIG. 5. In FIG. 6, reference numerals 51 and 52 denote the source terminals of the FET 50, reference numeral 53 denotes a gate terminal, and reference numeral 54 denotes a drain terminal. The portions indicated by 55 and 56 are active areas; a field-effect transistor is formed in each of these portions, and the source terminals 51 and 52, the gate terminal 53, and the drain terminal 54 are each extended out. Between the source terminals 51 and 51, and the gate terminal 53 and the drain terminal 54, and between the gate terminal 53 and the drain terminal 54, and the source terminals 52 and 52, a slot line is formed, as shown in the figure. The cross-hatched portion is a viahole formation portion, and each terminal extends out to the back-surface side of the chip.

The arrows in the figure show the electric-field distribution of a signal which propagates through the slot line 12 and the coplanar line 16. The RF signal of the LSM mode, which propagates from top to bottom in the figure through the first planar dielectric line including the slot indicated by 14 in the figure, is converted into a mode (TE mode) of the slot line via the first line-conversion conductor pattern 10, and this TE-mode signal propagates through the slot line 12 and is applied, as a voltage signal, between the source and the gate of the FET 50. Meanwhile, the Lo signal of the LSM mode, which propagates from right to left in the figure through the second planar dielectric line including the slot indicated by 24, is coupled to the second line-conversion conductor pattern 17, is converted into the mode of the coplanar line, propagates through the coplanar line 16, and is applied, as a voltage signal, between the source and the gate via the slot line of the FET 50. Here, if a gate bias voltage and a drain bias voltage are applied via the center conductors 33 and 34 of the coplanar lines 31 and 32, respectively, frequency components (IF signal) between the RF signal and the Lo signal are generated by a non-linear parameter, such as mutual conductance of the FET. In that case, the RF signal is input at an opposite phase to the two FETs and the Lo signal is input at the same phase thereto, functioning as a balanced-type mixer. Normally, when a balanced-type mixer is constructed, since an opposite-phase waveform is generated, a circuit, such as a phase shifter, must be added. However, according to this embodiment, a special phase shifter is not required, and the circuit is formed into a small size.

Although in the example shown in FIG. 6 the chip is mounted in such a way that the surface on which the semiconductor devices are formed becomes the top surface, the chip may be mounted in such a way that the surface on which the semiconductor devices are formed faces downwards, and the circuit substrate 30 and the slot line of the FET are directly bump-connected. In this case, the slot line of the FET must be spaced apart from the dielectric plate by more than some tens of μm in order to prevent parasitic coupling with the dielectric plate, and a high degree of bump connection technology is required. However, since viaholes are not necessary, the construction of the FET can be simplified.

Further, in the example shown in FIG. 6, the RF signal is input from the first planar dielectric line and the Lo signal is input from the second planar dielectric line. However, if, conversely, the RF signal is input from the second planar dielectric line and the Lo signal is input from the first planar dielectric line, in a similar manner, this functions as a balanced-type mixer.

Figure 7:
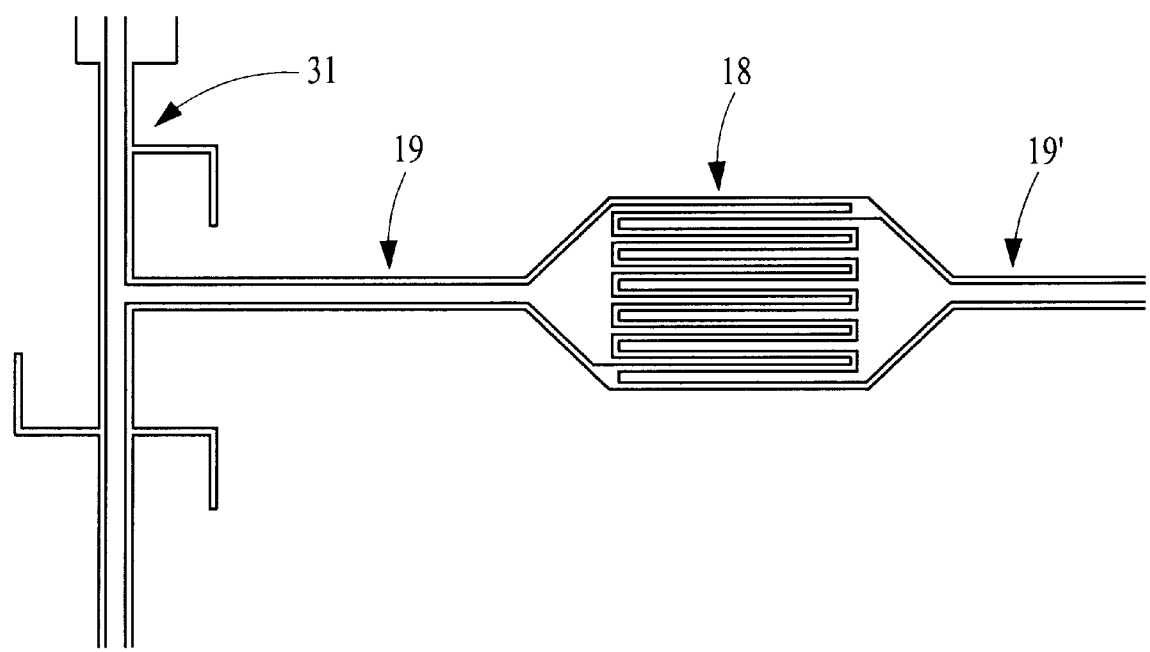
FIG. 7 is a view showing the construction of an interdigital capacitor.

FIG. 7 is a view showing the construction of an interdigital capacitor 18 shown in FIG. 1. In FIG. 7, reference numerals 19 and 19' each denote a coplanar line, with the center conductor of the coplanar line 19 branching from the center conductor of the coplanar line 31. The interdigital capacitor 18, which is used to generate capacitance between the center conductors of the coplanar line 19 and 19', forms an interdigital-type conductor pattern. In this embodiment, since the interdigital-type conductor pattern is formed in a dielectric plate with a high dielectric constant, a capacitor having a relatively large capacitance of 10 pF or more can be easily realized. In the coplanar line 31, by making the forward portion from the branching point of the coplanar line 19 have a high impedance, the leakage of the IF signal to the bias voltage supply circuit side is prevented.

As stated above, since in this high-frequency amplifier a planar dielectric line having a large effect of trapping a propagation electromagnetic field is used for input and output, parasitic coupling between this circuit and external circuits can be prevented. Further, since Q of the planar dielectric line is high (in the above-described example, Q>500), it is possible to minimize the transmission loss. Further, since the electrode patterns on the circuit substrate can be produced by using technology similar to a conventional circuit-substrate manufacturing technology using photolithography, the electrode patterns can be manufactured very easily and at a low cost.

Figure 8:
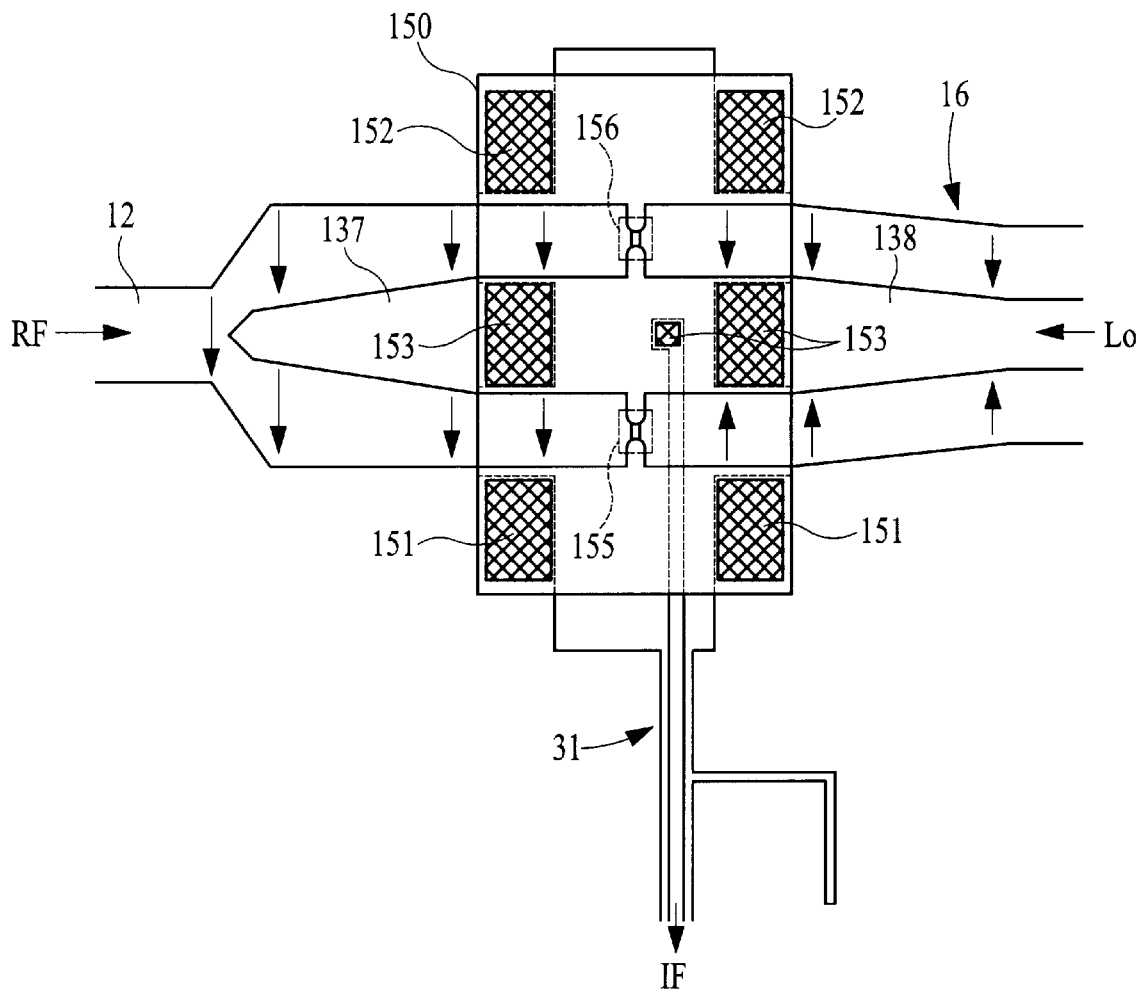
FIG. 8 is a view showing the construction of the main portion of a mixer according to a second embodiment of the present invention.

Next, the construction of the main portion of a mixer according to a second embodiment of the present invention will be described with reference to FIG. 8. Although in the example shown in FIG. 6 an FET is used, in this second embodiment, a mixer diode is used. FIG. 8 shows the mounting portion of the mixer diode. In FIG. 8, reference numeral 150 denotes a mixer diode, reference numeral 151 denotes a cathode terminal, reference numeral 152 denotes an anode terminal, and reference numeral 153 denotes a cathode/anode terminal. The portions indicated by 155 and 156 are active areas, each of which form a diode. Between the cathode terminals 151 and 151, and the cathode/anode terminals 153 and 153, and between the cathode/anode terminals 153 and 153, and the anode terminals 152 and 152, a slot line is formed as shown in the figure. The cross-hatched portion is a viahole formation portion, and each terminal extends out to the back-surface side of the chip.

The arrows in the figure show the electric-field distribution of a signal which propagates through the slot line 12 and the coplanar line 16. The RF signal of the slot-line mode, which propagates from left to right in the figure, is made to branch at a conductor 137 for branching a slot line, and is applied, as a voltage signal, between the anode and the cathode of each of the two diodes of the mixer diode 150. Meanwhile, the Lo signal of the coplanar line mode, which propagates from right to left in the figure, is applied, as a voltage signal, between the anode and the cathode. Here, if a bias voltage is applied between the anode and the cathode of each of the two diodes via the center conductor of the coplanar line 31, frequency components (IF signal) between the RF signal and the Lo signal are generated by a non-linear parameter of the diode. In that case, the RF signal is input at an opposite phase to the two diodes and the Lo signal is input at the same phase thereto, functioning as a balance-type mixer. Also in this case, in the same way as in the first embodiment, a small balance-type mixer can be constructed without adding a circuit, such as a phase shifter.

Incidentally, although the mixer using the FET as in the first embodiment makes it possible to reduce the conversion loss to a range of 0 to 4 dB by using the amplification function of the FET, the NF characteristic is generally deteriorated to 10 dB or more. If the diode is used as in this second embodiment, the conversion loss is as large as 5 to 8 dB or more; however, an NF characteristic of equal to or less than 6 dB can be obtained. Further, there is the advantage that the power consumption is small.

In the example shown in FIG. 8, the RF signal is input from the slot line and the Lo signal is input from the coplanar line. However, even if, conversely, the RF signal is input from the coplanar line and the Lo signal is input from the slot line, in a similar manner, this functions as a balance-type mixer.

Next, the construction of a multiplier (a second harmonic-wave generator) according to a third embodiment of the present invention will be described with reference to FIG. 9.

Figure 9:
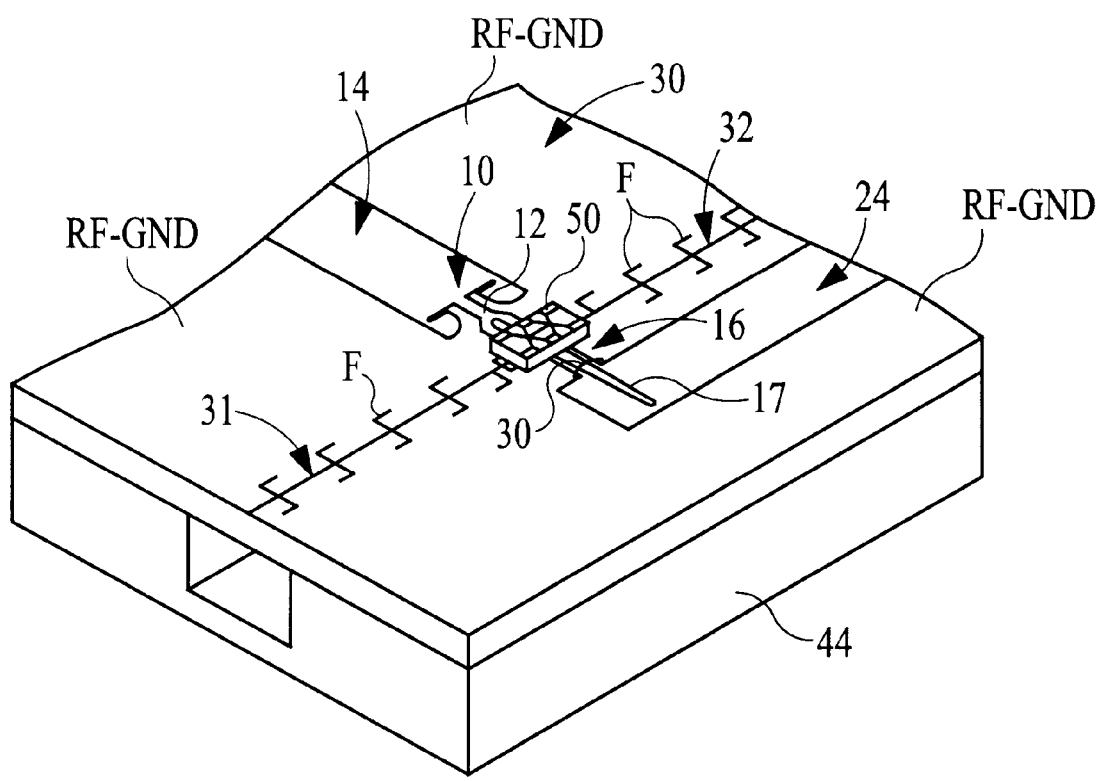
FIG. 9 is an exploded perspective view of a multiplier according to a third embodiment of the present invention.

FIG. 9 is a perspective view in a state (the upper-part conductor plate is removed) in which the circuit substrate 30 is placed on the low-part conductor plate 44. This multiplier is, from a construction viewpoint, such that basically, the interdigital capacitor 18 is removed from the mixer shown in FIG. 1B. Therefore, in the low-part conductor plate 44 and the upper-part conductor plate of this multiplier, grooves for providing a space in the periphery of the interdigital capacitor 18 shown in FIG. 1B and the coplanar line which is connected thereto are not formed.

In the construction shown in FIG. 9, the input signal, which is propagated from the first planar dielectric line including the slot 14, is coupled to the first line-conversion conductor pattern 10, is converted into the mode of the slot line, and is input between the gate and the source of the FET 50 of a slot-line input structure at a phase difference of 180° due to the division of the slot line 12. In this FET 50, a bias voltage is applied in the vicinity of a threshold value at which harmonic waves are generated strongly, and a fundamental wave and a second harmonic wave from among the generated harmonic waves are output from between the drain and the source of the FET. At this time, since the fundamental wave is out of phase by 180° in the same manner as on the input side, the fundamental wave propagates through the coplanar line 16 in the slot mode as is, but since the phases of the the second harmonic waves coincide with each other (the phase difference is 0°), the second harmonic wave propagates through the coplanar line 16 in the coplanar mode. In the mode conversion portion between the second planar dielectric line including a slot 24, and the coplanar line 16, the second line-conversion conductor pattern 17 which projects from the center conductor of the coplanar line 16 and the second planar dielectric line are coupled to each other, and mode conversion is performed. However, since the fundamental wave is out of phase, this is reflected without being converted. Therefore, only the second harmonic wave is output to the second planar dielectric line so that the leakage of the fundamental wave to the output side is prevented. For example, by inputting a signal of 30 GHz from the first planar dielectric line, it is possible to output only the desired 60-GHz signal from the second planar dielectric line.

In this way, a small balanced-type multiplier which does not leak a fundamental wave can be easily constructed by the converter between the planar dielectric line and the slot line, and the converter between the planar dielectric line and the coplanar line. In the connection joint of the second planar dielectric line and the coplanar line 16, if the electrodes on both sides of the coplanar line 16 are connected by a wire 30 shown in the figure or if these are connected by the conductors of multilayered wiring, the fundamental wave can be suppressed more reliably.

Although in each embodiment a planar dielectric integrated circuit using two of the first and second line-conversion conductor patterns is described as an example, similarly, by providing a coplanar line at the end portion or at the midpoint of the planar dielectric line and by providing only one line-conversion conductor pattern which projects from the center conductor of the coplanar line in a direction at right angles to the planar dielectric line, it is possible to construct an integrated circuit of a planar dielectric line and electronic components. Further, by providing a coplanar line at the end portion or at the midpoint of each of the two planar dielectric lines and by providing two monopole-type line-conversion conductor patterns which project from the center conductors of the two coplanar lines in a direction at right angles to the respective planar dielectric lines, it is possible to construct an integrated circuit of the two planar dielectric lines and the electronic components. According to the latter construction, it becomes possible to perform signal processing, such as amplification, on a signal which enters from one planar dielectric line and to output the signal to the other planar dielectric line.

According to the invention, since the space between the planar dielectric line and the electronic components is connected via the line-conversion conductor pattern and the coplanar line, it is possible to perform integration by reducing the signal loss in the connection section of the planar dielectric line and the electronic components and while maintaining a low loss characteristic, which is a feature of the planar dielectric line.

According to the invention, since two signals which propagate through the first and second planar dielectric lines are input to the electronic components in each of the slot line mode and the coplanar line mode, it is possible to construct easily an integrated circuit which performs signal processing, such as synthesizing two signals, using electronic components. In the case where, for example, this electronic component is a mixer FET or a mixer diode, by inputting an RF signal and a Lo signal from the first and second planar dielectric lines, respectively, a balance-type mixer is constructed, and an IF signal can be taken from the bias voltage supply line to the external source.

According to the invention, impedance matching is obtained between the line-conversion conductor pattern and the electronic components, and the loss in the connection section of the slot line or the coplanar line, and the electronic components is reduced.

According to the invention, impedance matching is obtained between the line-conversion conductor pattern and the slot line or the coplanar line, thereby suppressing unwanted reflection and reducing the transmission loss caused by line conversion.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A planar dielectric integrated circuit, comprising:
   a planar dielectric line wherein a first slot is provided by disposing two conductors at a fixed distance on a first main surface of a dielectric plate, a second slot, which opposes the first slot, is provided by disposing two conductors at a fixed distance on a second main surface of said dielectric plate, with the area sandwiched between said first slot and said second slot of said dielectric plate being formed as a plane-wave propagation area;
   a coplanar line provided at the end portion or at the midpoint of said planar dielectric line;
   a line-conversion conductor pattern which projects from the center conductor of the coplanar line in a direction at right angles to the planar dielectric line; and
   electronic components disposed in such a manner as to be extended over said coplanar line.

2. A planar dielectric integrated circuit according to claim 1, wherein an impedance matching circuit is provided between first said line-conversion conductor pattern and said slot line.

3. A planar dielectric integrated circuit, comprising:

two planar dielectric lines, each of which is provided with a first slot provided by disposing two electrodes at a fixed distance on a first main surface of a dielectric plate, a second slot, which opposes the first slot, provided by disposing two electrodes at a fixed distance on a second main surface of said dielectric plate, with the area sandwiched between said first slot and said second slot of said dielectric plate being formed as a plane-wave propagation area;

a slot line formed at the end portion of the first planar dielectric line;

a first line-conversion conductor pattern, which is connected to the electromagnetic field of the slot line and the first planar dielectric line, provided at one end portion of the slot line;

a coplanar line provided in the vicinity of the other end portion of said slot line;

a second line-conversion conductor pattern which projects from the center conductor at the end portion of the coplanar line in a direction at right angles to the second planar dielectric line; and electronic components disposed in such a manner as to be extended over said coplanar line and said slot line.

4. A planar dielectric integrated circuit according to claim 3, wherein a short stub which is used to obtain impedance matching between said first line-conversion conductor patterns and said electronic components is provided at the midpoint of said slot line.

* * * * *